United States Patent
Nagao et al.

(10) Patent No.: US 11,758,696 B2
(45) Date of Patent: Sep. 12, 2023

(54) COOLING STRUCTURE AND COOLING CONTROL SYSTEM

(71) Applicant: TOYOTA JIDOSHA KABUSHIKI KAISHA, Toyota (JP)

(72) Inventors: Kenichi Nagao, Toyota (JP); Hiromi Yamanashi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 218 days.

(21) Appl. No.: 17/110,411

(22) Filed: Dec. 3, 2020

(65) Prior Publication Data

US 2021/0185862 A1    Jun. 17, 2021

(30) Foreign Application Priority Data

Dec. 12, 2019    (JP) .................................. 2019-224652

(51) Int. Cl.
*H05K 7/20*    (2006.01)
*B60H 1/00*    (2006.01)

(52) U.S. Cl.
CPC ..... *H05K 7/20863* (2013.01); *B60H 1/00878* (2013.01)

(58) Field of Classification Search
CPC .......................... H05K 7/20863; B60H 1/00878
USPC ....................................................... 361/695
See application file for complete search history.

(56) References Cited

U.S. PATENT DOCUMENTS

| | | | | |
|---|---|---|---|---|
| 5,297,005 A * | 3/1994 | Gourdine | ........... | H05K 7/20154 361/695 |
| 5,422,787 A * | 6/1995 | Gourdine | ........... | H05K 7/20154 361/695 |
| 8,029,343 B2 * | 10/2011 | Major | ................. | H01M 10/615 62/244 |
| 8,717,761 B2 * | 5/2014 | Aoki | ........................ | B60K 1/04 180/68.5 |
| 8,837,140 B2 * | 9/2014 | Zurowski | ........... | H05K 7/20154 361/691 |
| 2004/0074248 A1 * | 4/2004 | Tanaka | ............... | B60H 1/00514 62/244 |
| 2020/0313256 A1 * | 10/2020 | Kuronuma | .......... | H01M 10/663 |
| 2021/0379958 A1 * | 12/2021 | Hsiao | ...................... | G06F 1/182 |
| 2022/0029219 A1 * | 1/2022 | Hara | ................. | H01M 10/6563 |

FOREIGN PATENT DOCUMENTS

| | | | |
|---|---|---|---|
| JP | 2005-306195 A | 11/2005 | |
| JP | 2005-324771 A | 11/2005 | |
| JP | 2007-74798 A | 3/2007 | |
| JP | 2016-32367 A | 3/2016 | |
| WO | WO-2015092269 A1 * | 6/2015 | ............... B60K 1/04 |

* cited by examiner

*Primary Examiner* — Anatoly Vortman
(74) *Attorney, Agent, or Firm* — Oblon, McClelland, Maier & Neustadt, L.L.P.

(57) ABSTRACT

A cooling structure for an electronic control unit which is mounted in a vehicle, includes: a duct having a flow channel on which the electronic control unit is disposed; and a blower configured to take air in the inside of the vehicle and to emit the air to the flow channel of the duct, wherein the duct is configured to: cool the electronic control unit with the air emitted from the blower; and discharge air which has been used to cool the electronic control unit to the outside of the vehicle.

4 Claims, 4 Drawing Sheets

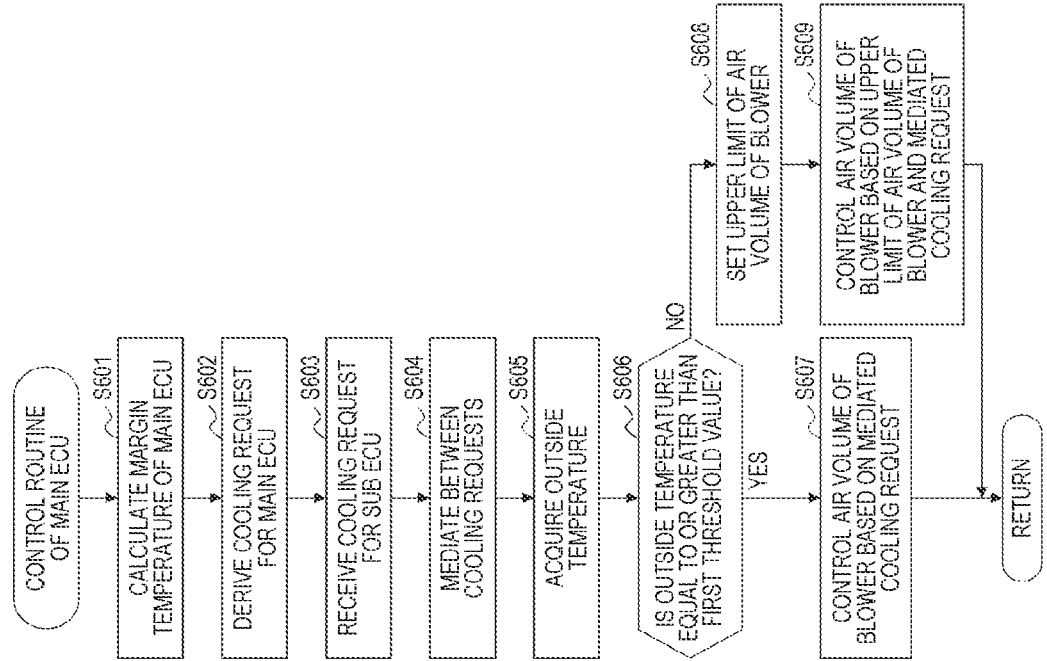
FIG. 6
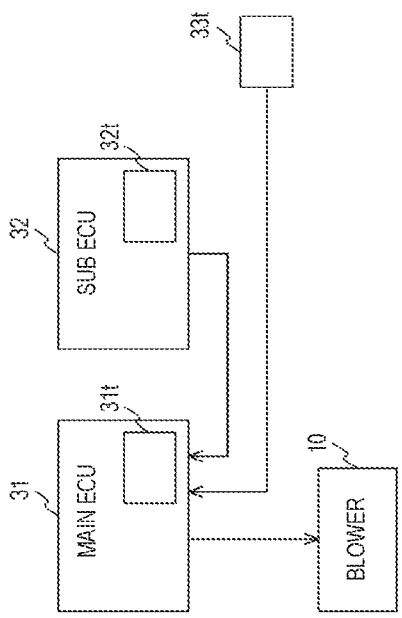
FIG. 4
FIG. 5

COOLING STRUCTURE AND COOLING CONTROL SYSTEM

CROSS-REFERENCE TO RELATED APPLICATION

This application claims priority to Japanese Patent Application No. 2019-224652 filed on Dec. 12, 2019, incorporated herein by reference in its entirety.

BACKGROUND

1. Technical Field

The disclosure relates to a cooling structure and a cooling control system.

2. Description of Related Art

Electronic control units mounted in vehicles include those which emit large amounts of heat due to operation of the units. For such electronic control units that emit heat, it is necessary to secure stabilization of the operation by curbing excessive increases in temperature.

German Utility Model No. 202014104445 (DE 202014104445 U) discloses a structure in which a housing having an electronic control unit accommodated therein is provided in an air flow channel (a duct) and the electronic control unit is cooled with cold air flowing in the air flow channel (the duct). As disclosed in DE 202014104445 U, it is possible to prevent an excessive increase in temperature of the electronic control unit by bringing air into contact with the electronic control unit to forcibly cool the electronic control unit.

SUMMARY

As a structure for cooling an electronic control unit using a duct in which air flows or the like, a flow channel into which cooling air is taken in from the inside of a vehicle and the air which has been used to cool the electronic control unit is discharged to the inside of the vehicle is considered. However, in such a flow channel circulating in the inside of the vehicle, warm air which has been used to cool the electronic control unit returns to the inside of the vehicle and there is a likelihood that an occupant will feel unpleasant warmth.

The disclosure provides a cooling structure and a cooling control system for an electronic control unit that can prevent an occupant from feeling unpleasant warmth.

A cooling structure according to a first aspect of the disclosure is a cooling structure for an electronic control unit which is mounted in a vehicle. The cooling structure includes: a duct having a flow channel on which the electronic control unit is disposed; and a blower configured to take air in the inside of the vehicle and to emit the air to the flow channel of the duct, wherein the duct is configured to: cool the electronic control unit with the air emitted from the blower; and discharge air which has been used to cool the electronic control unit to the outside of the vehicle.

A cooling control system according to a second aspect of the disclosure is a system that cools an electronic control unit which is mounted in a vehicle. The system includes: a duct having a flow channel on which the electronic control unit is disposed; a blower configured to take air in the inside of the vehicle and to emit the air to the flow channel of the duct; and a controller configured to control an air volume which is emitted by the blower, wherein the duct is configured to: cool the electronic control unit with the air emitted from the blower under the control of the controller; and discharge air which has been used to cool the electronic control unit to the outside of the vehicle.

With the cooling structure and the cooling control system for an electronic control unit according to the disclosure, since cooling air is taken in from the inside of the vehicle and air which has been used to cool the electronic control unit is discharged to the outside of the vehicle, it is possible to prevent an occupant from feeling unpleasant warmth.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 4 is a block diagram schematically illustrating a configuration of a cooling control system according to the embodiment;

FIG. 5 is a flowchart illustrating a control routine which is performed by a sub ECU according to the embodiment;

FIG. 6 is a flowchart illustrating a control routine which is performed by a main ECU according to the embodiment;

DETAILED DESCRIPTION OF EMBODIMENTS

Embodiment

A cooling structure according to the disclosure employs a structure that takes in air for cooling an electronic control unit from the inside of a vehicle and discharges air which has been used to cool the electronic control unit to the outside of the vehicle. With this structure, warm air which has been used to cool the electronic control unit does not return to the inside of the vehicle and there is no concern of an occupant feeling unpleasant warmth. Hereinafter, an embodiment of the disclosure will be described in detail with reference to the accompanying drawings.

Cooling Structure

Figure 1:
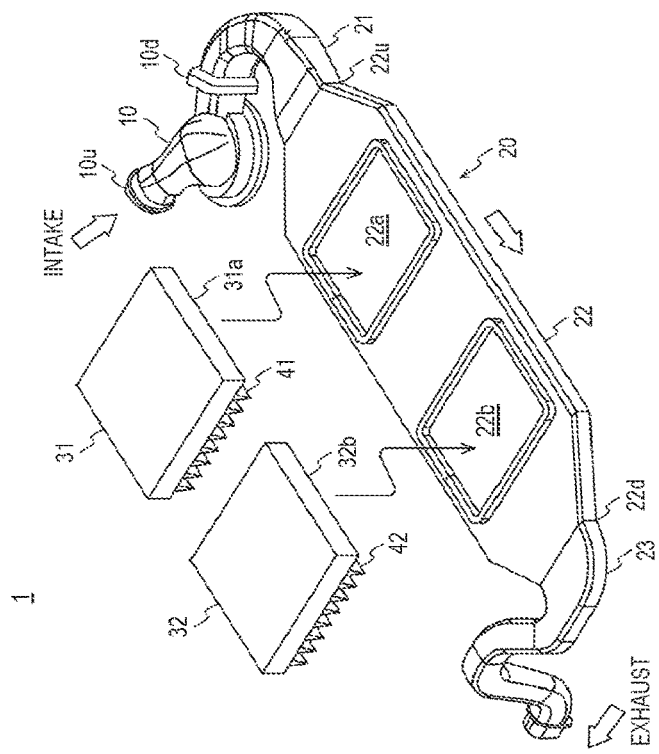
FIG. 1 is a perspective view schematically illustrating a principal structure of a cooling structure for an electronic control unit according to an embodiment of the disclosure.

FIG. 1 is a perspective view schematically illustrating a principal structure of a cooling structure 1 for an electronic control unit according to an embodiment of the disclosure. The cooling structure 1 according to this embodiment illustrated in FIG. 1 includes a blower 10 and a duct 20. In this embodiment, two electronic control units 31 and 32 are cooled, but the number of electronic control units which are cooled may be one or three or more.

The blower 10 is an air blower that takes air from an inlet port 10*u* and discharges air from an outlet port 10*d* with rotation of an impeller. An air volume which is discharged from the outlet port 10*d* can be changed by causing a controller which will be described later to control the rotation of the impeller.

The duct 20 is a cooling pipe in which cooling air for cooling the electronic control units 31 and 32 flows. The duct 20 includes a cooling duct 22, an intake duct 21 that extends from an upstream end 22*u* of the cooling duct 22 and is connected to the outlet port 10*d* of the blower 10, and an exhaust duct 23 that extends from a downstream end 22*d* of the cooling duct 22 to the outside of the vehicle. The exhaust duct 23 itself may not extend to the outside of the vehicle, but may be connected to another duct extending to the outside of the vehicle. A check valve that prevents a reverse flow of outside air to the cooling duct 22 (that is, the inside of the vehicle) may be provided in the exhaust duct 23, or a seal structure that prevents infiltration of water, dust, or the like from the outside may be provided.

The cooling duct 22 includes an opening 22*a* in which the electronic control unit 31 is placed and an opening 22*b* in which the electronic control unit 32 is placed. A heat sink 41 which is thermally coupled thereto is provided in a part of a housing surface of the electronic control unit 31. A heat sink 42 which is thermally coupled thereto is provided in a part of a housing surface of the electronic control unit 32. The heat sinks 41 and 42 each have, for example, a shape in which a plurality of fins are made to stand in parallel. The opening 22*a* of the cooling duct 22 is sealed with the housing surface 31*a* of the electronic control unit 31 on which the heat sink 41 is provided. The opening 22*b* of the cooling duct 22 is sealed with the housing surface 32*b* of the electronic control unit 32 on which the heat sink 42 is provided. Accordingly, air flowing in the duct 20 can come into contact with the heat sinks 41 and 42 and take away heat therefrom to cool the electronic control units 31 and 32.

When the electronic control units 31 and 32 are placed in the openings 22*a* and 22*b* such that the plurality of fins of the heat sinks 41 and 42 face in a direction parallel to a direction from the upstream end 22*u* of the cooling duct 22 to the downstream end 22*d* (an arrow in FIG. 1), it is possible to improve cooling efficiency.

Figure 2:
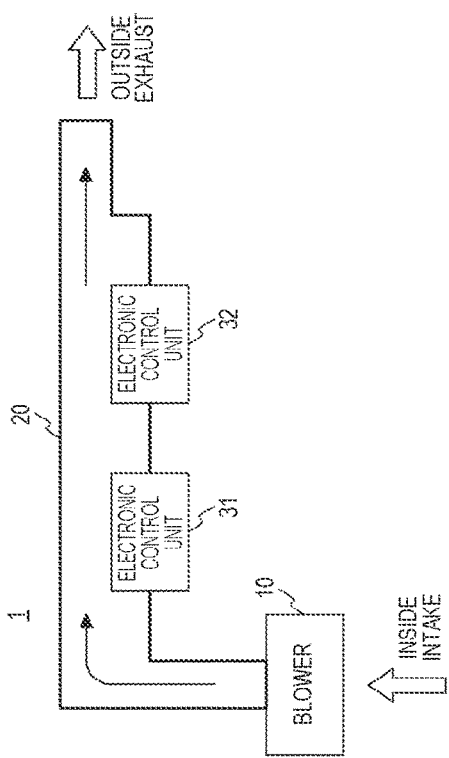
FIG. 2 is a diagram illustrating an example in which the cooling structure illustrated in FIG. 1 is applied to a vehicle.

FIG. 2 illustrates a specific example in which the cooling structure 1 according to this embodiment illustrated in FIG. 1 is applied to a vehicle. In the example illustrated in FIG. 2, the cooling structure 1 is mounted in a luggage compartment of a vehicle, air is taken in from the right-rear side of a passenger compartment which is a space in which an occupant sits, and air is discharged from below a left surface of the vehicle to the outside of the vehicle. FIG. 2 illustrates only an example, and a mounting position of the cooling structure 1 is not limited to the example illustrated in FIG. 2 as long as it can take in air from the passenger compartment and discharge air to the outside of the vehicle.

Figure 3:
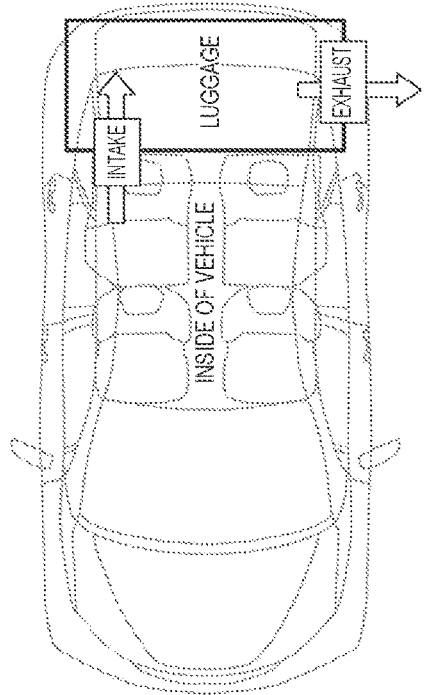
FIG. 3 is a diagram schematically illustrating a flow channel of the cooling structure illustrated in FIG. 1.

FIG. 3 is a diagram schematically illustrating a flow channel of the cooling structure 1 which is mounted in a luggage compartment of a vehicle as illustrated in FIG. 2. The blower 10 takes air from the passenger compartment and ejects the air into the duct 20 (inside intake). Air ejected into the duct 20 first cools the electronic control unit 31 and then cools the electronic control unit 32. Then, warm air which has been used to cool the electronic control units 31 and 32 is discharged to the outside of the vehicle (outside exhaust).

In this way, in the cooling structure 1 according to this embodiment, since the electronic control unit 31 is first cooled, the electronic control unit 31 may be an electronic control unit with a lowest heat-resistant temperature. When three or more electronic control units are cooled, the electronic control units may be arranged from upstream (the upstream end 22*u*) to downstream (the downstream end 22*d*) of the flow channel of the cooling duct 22 in increasing order of the heat-resistant temperature. By employing this arrangement, since the electronic control unit with a lower heat-resistant temperature can be preferentially cooled with air of a lower temperature, it is possible to efficiently cool all the electronic control units.

Cooling Control System

A cooling control system 100 that suitably controls cooling of the electronic control units 31 and 32 using the cooling structure 1 according to this embodiment will be described below. FIG. 4 is a block diagram schematically illustrating a configuration of the cooling control system 100 according to this embodiment.

In the cooling control system 100 according to this embodiment, the electronic control unit 31 and the electronic control unit 32 cooperatively control an air volume blown from the blower 10 using a detection unit 31*t* (a first detection unit) that is provided in the electronic control unit 31 and detects a temperature of the electronic control unit 31, a detection unit 32*t* (a first detection unit) that is provided in the electronic control unit 32 and detects a temperature of the electronic control unit 32, and a detection unit 33*t* (a second detection unit) that is mounted in the vehicle and detects an outside temperature. A temperature sensor or the like can be used as each detection unit.

In this embodiment, it is assumed that the electronic control unit 32 serves as a device that provides information to the electronic control unit 31 (hereinafter referred to as a "sub ECU"), and the electronic control unit 31 serves as a device that is supplied with information from the electronic control unit 32 and controls the blower 10 (hereinafter referred to as a "main ECU"). That is, the main ECU 31 serves as a controller of the cooling control system 100. Another electronic control unit may serve as a controller instead of the main ECU 31 and the sub ECU 32 which are to be cooled.

(1) Control of Sub ECU

FIG. 5 is a flowchart illustrating a control routine which is performed by the sub ECU 32 of the cooling structure 1. This control is performed for each sub ECU when there are two or more sub ECUs which are cooled by the cooling structure 1.

Step S501: The sub ECU 32 calculates a margin temperature of the unit. The margin temperature is a temperature difference between a current temperature and a prescribed heat-resistant temperature. Typically, the margin temperature is calculated for each control chip which is mounted on a board of the sub ECU 32. The current temperature of each control chip can be measured using the detection unit 32*t* included in the sub ECU 32. When the margin temperature has been calculated, the control routine proceeds to Step S502.

Step S502: The sub ECU 32 derives a cooling request indicating an air volume which is required to cool the unit based on the margin temperature which has been calculated for each control chip. Specifically, based on a minimum margin temperature (with a smallest margin with respect to the heat-resistant temperature) out of a plurality of margin temperatures which have been calculated for a plurality of control chips, the sub ECU 32 determines an air volume which is required to cool the unit such that the minimum margin temperature is not equal to or lower than zero. This required air volume can be determined, for example, using a table in which a relationship between a margin temperature and an air volume is defined in advance. When the cooling request indicating the air volume which is required to cool the sub ECU 32 has been derived, the control routine proceeds to Step S503.

Step S503: The sub ECU 32 transmits the cooling request derived for the unit to the main ECU 31. Transmission of the cooling request may be constantly performed, may be performed at intervals of a predetermined constant time, or may be performed at a time at which details (an air volume) of the cooling request have changed.

Steps S501 to S503 are repeatedly performed at least while a power supply of the vehicle is turned on.

(2) Control of Main ECU

FIG. 6 is a flowchart illustrating a control routine which is performed by the main ECU 31 of the cooling structure 1.

Step S601: The main ECU 31 calculates a margin temperature of the unit. The margin temperature is a temperature difference between a current temperature and a prescribed heat-resistant temperature. Typically, the margin temperature is calculated for each control chip which is mounted on a board of the main ECU 31. The current temperature of each control chip can be measured using the detection unit 31$t$ included in the main ECU 31. When the margin temperature has been calculated, the control routine proceeds to Step S602.

Step S602: The main ECU 31 derives a cooling request indicating an air volume which is required to cool the unit based on the margin temperature which has been calculated for each control chip. Specifically, based on a minimum margin temperature (with a smallest margin with respect to the heat-resistant temperature) out of a plurality of margin temperatures which have been calculated for a plurality of control chips, the main ECU 31 determines an air volume which is required to cool the unit such that the minimum margin temperature is not equal to or lower than zero. This required air volume can be determined, for example, using a table in which a relationship between a margin temperature and an air volume is defined in advance. When the cooling request indicating the air volume which is required to cool the main ECU 31 has been derived, the control routine proceeds to Step S603.

Step S603: The main ECU 31 receives the cooling request derived by the sub ECU 32 from the sub ECU 32. When there are two or more sub ECUs, the main ECU 31 receives the cooling request from the respective sub ECUs. When the cooling requests have been received from the sub ECUs 32, the control routine proceeds to Step S604.

Step S604: The main ECU 31 mediates between the cooling request for the main ECU 31 derived for its own unit and the cooling request for the sub ECU received from the sub ECU 32. Typically, the main ECU 31 performs mediation by selecting the cooling request with the largest air volume out of the air volumes of the blower 10 which are indicated by the cooling requests. When mediation between the cooling requests is performed, the control routine proceeds to Step S605.

Step S605: The main ECU 31 acquires an outside temperature. The outside temperature can be measured by the detection unit 33$t$ which is mounted in the vehicle. When the outside temperature is measured, the control routine proceeds to Step S606.

Step S606: The main ECU 31 determines whether the outside temperature is equal to or greater than a first threshold value. This determination is performed to determine whether an occupant feels unpleasant coolness due to outside air which flows from gaps between seats, interior furnishings, and doors because the pressure in the passenger compartment becomes negative due to discharge of inside air to the outside. Accordingly, the first threshold value is set to a predetermined temperature at which an occupant is predicted to feel unpleasant coolness from infiltration air of that temperature. The control routine proceeds to Step S607 when the outside temperature is equal to or greater than the first threshold value (YES in S606), and the control routine proceeds to Step S608 when the outside temperature is less than the first threshold value (NO in S606).

Step S607: The main ECU 31 controls the air volume of the blower 10 based on the mediated cooling request. The air volume of the blower 10 can be controlled, for example, by changing a duty ratio of a PWM signal for rotating an impeller of the blower 10. Through this control, since the temperature of infiltration air is equal to or greater than the first threshold value even when outside air infiltrates into the passenger compartment through the gaps, it is possible to prevent an occupant from feeling unpleasant coolness from the infiltration air. When the air volume of the blower 10 is controlled, the control routine returns to Step S601.

Step S608: The main ECU 31 sets an upper limit of the air volume of the blower 10. The upper limit is set to limit an amount of outside air which infiltrates from gaps between seats, interior furnishings, and doors such that an occupant is less likely to feel unpleasant coolness. The upper limit of the air volume can be set, for example, by limiting a variable upper limit of a duty ratio of a PWM signal for rotating the impeller of the blower 10. The upper limit may be a fixed value or a variable value which varies depending on the outside temperature. When the upper limit of the air volume of the blower 10 is set, the control routine proceeds to Step S609.

Step S609: The main ECU 31 controls the air volume of the blower 10 based on the upper limit of the air volume of the blower 10 and the mediated cooling request. Specifically, the main ECU 31 controls the blower 10 with an air volume indicated by the cooling requests when the air volume is less than the upper limit, and controls the blower 10 with the air volume of the upper limit (that is, the air volume of the air blower 10 is limited to the upper limit) when the air volume indicated by the cooling requests is equal to or greater than the upper limit. The air volume of the blower 10 can be controlled, for example, by changing a duty ratio of a PWM signal for rotating the impeller of the blower 10. Through this control, since an amount of infiltration air is small even when outside air equal to or greater than the first threshold value infiltrates into the passenger compartment through the gaps, it is possible to prevent an occupant from feeling unpleasant coolness from the infiltration air. When the air volume of the blower 10 is controlled, the control routine returns to Step S601.

Steps S601 to S609 are repeatedly performed at least while a power supply of the vehicle is turned on.

Operations/Advantages

As described above, in the cooling structure and the cooling control system for an electronic control unit according to an embodiment of the disclosure, a structure in which air for cooling the electronic control unit is taken in from the passenger compartment and air which has been used to cool the electronic control unit is discharged to the outside is employed. With this structure, warm air which has been used to cool the electronic control unit is not returned to the passenger compartment and thus there is no concern of an occupant feeling unpleasant warmth.

In the cooling structure and the cooling control system for an electronic control unit according to this embodiment, control for determining whether the outside temperature is equal to or greater than the first threshold value and curbing an air volume of the blower when the outside temperature is less than the first threshold value is performed. Through this control, even when outside air flows from gaps between seats, interior furnishings, and doors because the pressure of the passenger compartment becomes negative due to discharge of the inside air to the outside, the amount of outside air flowing in is small and thus it is possible to prevent an occupant from feeling unpleasant coolness from the outside air.

Flowing of outside air into the passenger compartment due to a negative pressure can be caused in spring, summer, and fall as well as winter when the outside temperature is much lower than the inside temperature. However, in spring or fall, even when outside air flows into the passenger compartment due to the negative pressure, the inside temperature and the outside temperature are almost the same and thus there is no temperature change and an occupant does not feel unpleasant coolness or unpleasant warmth. In summer, the passenger compartment is supposed to be cooled with an air conditioner in a state in which windows are closed and a negative pressure is caused, and it is considered less likely for an occupant to feel unpleasant warmth from the outside air due to cooling air from the air conditioner even when the outside temperature is much higher than the inside temperature. Accordingly, in the cooling structure and the cooling control system for an electronic control unit according to this embodiment, control for determining whether the outside temperature is equal to or greater than the first threshold value and curbing an air volume of the blower when the outside temperature is less than the first threshold value is performed.

MODIFIED EXAMPLES

Figure 7:
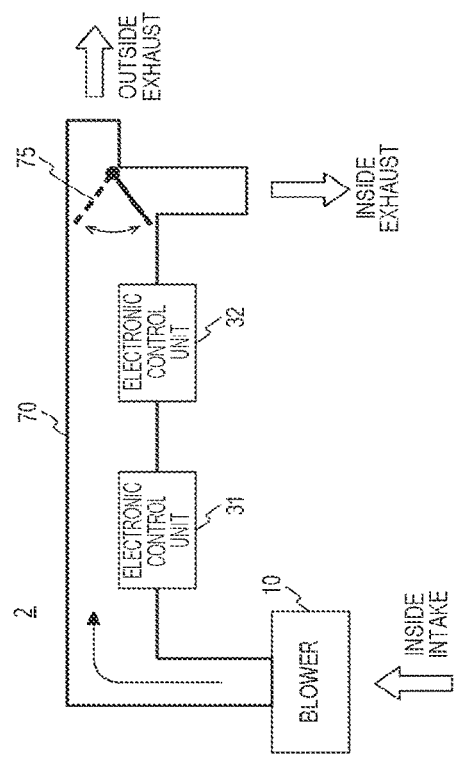
FIG. 7 is a diagram schematically illustrating a flow channel of a cooling structure according to a modified example of the embodiment.

FIG. 7 is a diagram schematically illustrating a flow channel of a cooling structure 2 according to a modified example of the embodiment of the disclosure. The cooling structure 2 according to the modified example illustrated in FIG. 7 is different from the cooling structure 1 according to the above embodiment in that a duct 70 has a different shape and a switching valve 75 is further provided.

The duct 70 is the same as the duct 20 in a part corresponding to an intake duct connected to the blower 10 located upstream, but is different from the duct 20 in that a part corresponding to an exhaust duct located downstream branches into a first exhaust channel connected to the outside and a second exhaust channel connected to the inside.

The switching valve 75 is provided at a position in the duct 70 at which the first exhaust channel connected to the outside and the second exhaust channel connected to the inside branch from each other, and performs a switching operation of setting up one of the first exhaust channel and the second exhaust channel based on an instruction from the controller.

Figure 8:
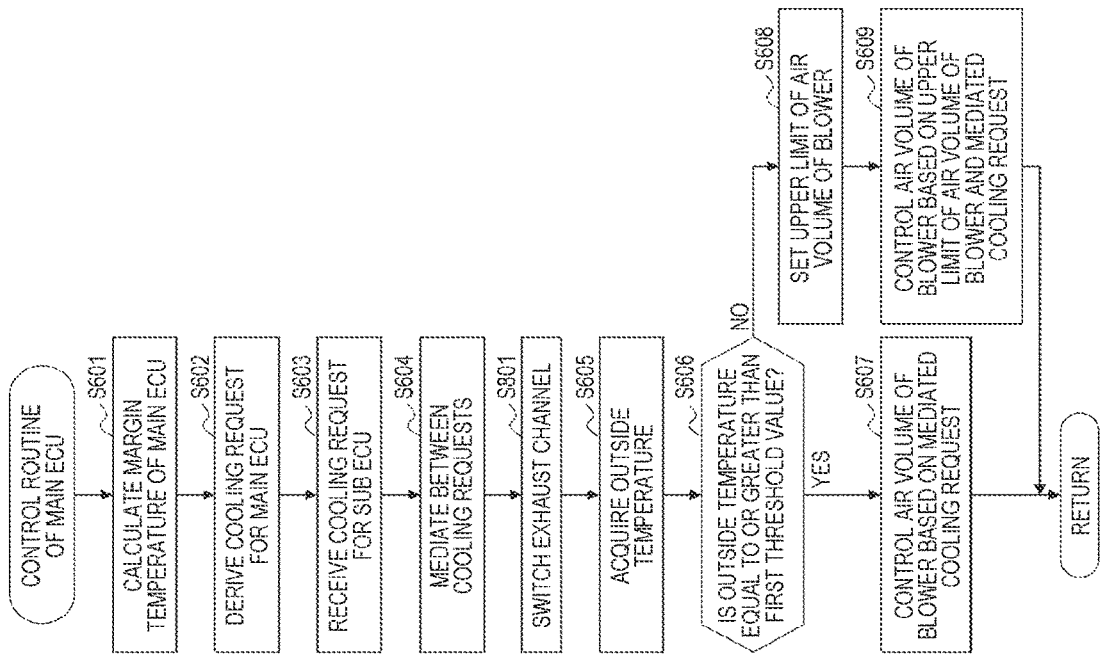
FIG. 8 is a flowchart illustrating a control routine which is performed by a main ECU according to the modified example.

FIG. 8 illustrates an example of a flowchart of a control routine which is performed by the main ECU 31 of the cooling structure 2. In the control routine illustrated in FIG. 8, a process of switching the exhaust channel (Step S801) is performed after mediation between the cooling requests from a plurality of ECUs is performed (Step S604). Switching of the exhaust channel can be determined based on information indicating surroundings of the vehicle (such as the inside temperature, the outside temperature, the temperatures of the ECUs, the weather, and the time).

By employing the cooling structure 2 according to this modified example, for example, in winter when the outside temperature is much lower than the inside temperature, the exhaust channel of the duct 70 can be switched by the switching valve 75 such that the second exhaust channel connected to the passenger compartment is set up, and the inside air can be circulated. Accordingly, since air which has been heated by cooling the electronic control units 31 and 32 can be returned to the passenger compartment, it is possible to efficiently heat the passenger compartment without wasting thermal energy.

APPLICATION EXAMPLES

Figure 9:
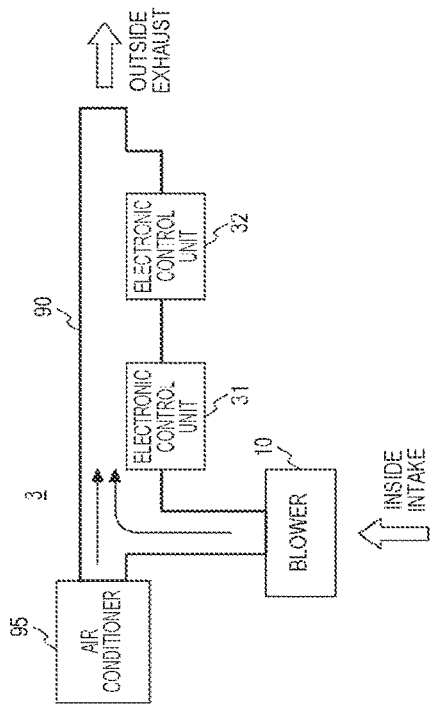
FIG. 9 is a diagram schematically illustrating a flow channel of a cooling structure according to an application example of the embodiment.

FIG. 9 is a diagram schematically illustrating a flow channel of a cooling structure 3 according to an application example of an embodiment of the disclosure. The cooling structure 3 according to the application example illustrated in FIG. 9 is different from the cooling structure 1 according to the above embodiment in that a duct 90 has a different shape and an air conditioner 95 is further provided.

The duct 90 is the same as the duct 20 in a part corresponding to the exhaust duct located downstream, but is different from the duct 20 in that a part corresponding to the intake duct located upstream branches into a first intake channel connected to the blower 10 and a second intake channel connected to the air conditioner 95.

Typically, an air conditioner which is mounted in advance in the vehicle is used as the air conditioner 95, but a dedicated air conditioner for cooling the electronic control units 31 and 32 may be mounted. In the air conditioner 95, all air outlet ports do not have to be connected to the second intake channel of the duct 90, and some air outlet ports can be connected to the second intake channel.

Figure 10:
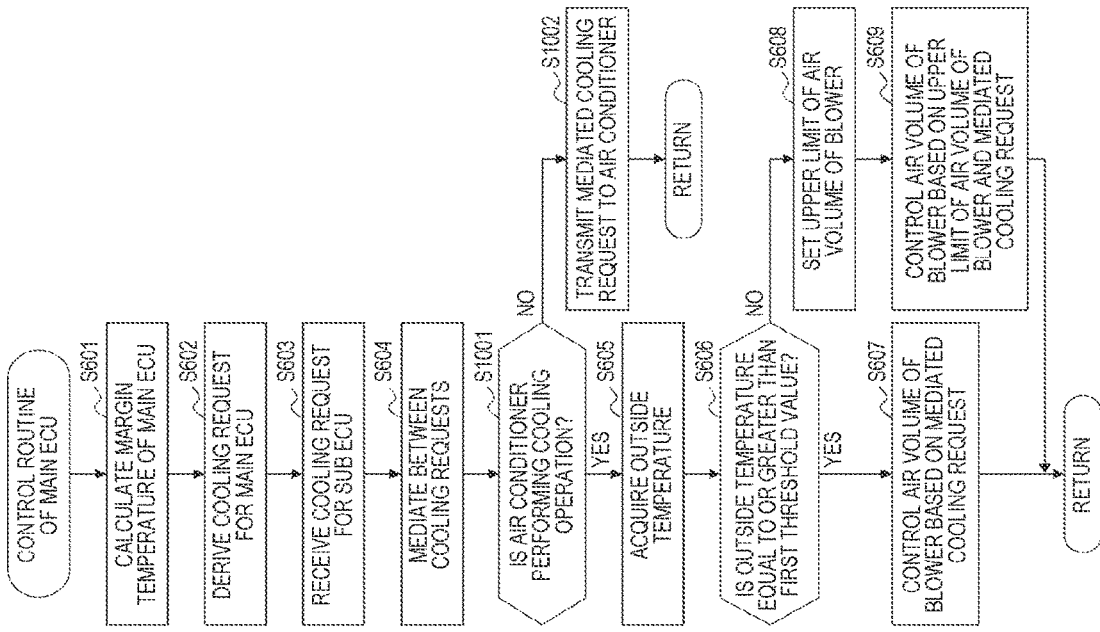
FIG. 10 is a flowchart illustrating a control routine which is performed by a main ECU according to the application example.

FIG. 10 illustrates an example of a flowchart of a control routine which is performed by the main ECU 31 of the cooling structure 3. In the control routine illustrated in FIG. 10, a process of determining whether the air conditioner 95 is performing a cooling operation (Step S1001) is performed after mediation between the cooling requests from a plurality of ECUs is performed (Step S604). When the air conditioner 95 is performing a cooling operation (YES in Step S1001), the main ECU 31 transmits the mediated cooling request to the air conditioner 95 (Step S1002) to control emission of cooling air from the air conditioner 95. On the other hand, when the air conditioner 95 is not performing a cooling operation (NO in Step S1001), the main ECU 31 performs a process of cooling the electronic control units 31 and 32 with air from the blower 10 based on Steps S605 to S609.

By employing the cooling structure 3 according to this application example, for example, when the air conditioner 95 is performing a cooling operation, the operation of the blower 10 can be stopped and some cool air emitted from the air conditioner 95 can be made to flow in the duct 90, whereby it is possible to efficiently cool the electronic control units 31 and 32. When the air conditioner 95 is not performing a cooling operation or is performing a heating operation, the blower 10 is made to operate such that the inside air flows in the duct 90, and thus cools the electronic control units 31 and 32 similarly to the cooling structure 1 according to the above embodiment.

The cooling structure according to the disclosure can be used in a cooling control system for controlling cooling of an electronic control unit which is mounted in a vehicle.

What is claimed is:

1. A cooling structure for at least two electronic control units mounted in a vehicle, comprising:
    a duct including a flow channel on which the at least two electronic control units are disposed; and
    a blower configured to take air in the inside of the vehicle and to emit the air to the flow channel of the duct,
    wherein the duct is configured to:
        cool the at least two electronic control units with the air emitted from the blower; and
        discharge air which has been used to cool the at least two electronic control units to the outside of the vehicle,
    wherein the at least two electronic control units are arranged from upstream to downstream on the flow channel of the duct in increasing order of a heat-resistant temperature,
    wherein the duct includes a first opening and a second opening, the first opening being sealed with a surface of a first housing of a first electronic control unit including a first heat sink, the second opening being sealed with a surface of a second housing of a second electronic control unit including a second heat sink, and the first opening being arranged downstream on the flow channel of the duct from the second opening
    wherein the at least two electronic control units include the first electronic control unit and the second electronic control unit, and
    wherein the first electronic control unit has a higher heat-resistant temperature than the second electronic control unit.

2. The cooling structure according to claim 1, wherein the duct branches into a first exhaust channel connected the outside of the vehicle and a second exhaust channel connected in the inside of the vehicle.

3. The cooling structure according to claim 1, wherein the first electronic control and the second electronic control unit are spaced apart from each other.

4. The cooling structure according to claim 1, further comprising:
    an air conditioner connected to the flow channel in parallel with the blower, the blower blowing the air from inside the vehicle into a first intake channel of the flow channel, and the air conditioner blowing cooled air into a second intake channel of the flow channel.

* * * * *